(12) United States Patent
Boscha

(10) Patent No.: US 6,418,251 B1
(45) Date of Patent: Jul. 9, 2002

(54) LASER-DIODE ASSEMBLY FOR GENERATING A FREQUENCY-STABILIZED NARROW-BANDWIDTH LIGHT AND A METHOD OF NARROWING LINEWIDTH OF THE SPECTRUM

(76) Inventor: Bogie Boscha, 101 Hillside Ave., Metuchen, NJ (US) 08840

( * ) Notice: Subject to any disclaimer, the term of this patent is extended or adjusted under 35 U.S.C. 154(b) by 22 days.

(21) Appl. No.: 09/687,123

(22) Filed: Oct. 13, 2000

(51) Int. Cl.[7] ............................. G02B 6/42; H01S 3/13
(52) U.S. Cl. ...................... 385/31; 372/29.02; 372/32; 385/92; 385/93; 385/14; 385/27; 385/30; 385/31; 385/37; 385/10
(58) Field of Search ............................. 372/29.02, 32; 385/92, 93, 14, 27, 30, 31, 37, 10

(56) References Cited

U.S. PATENT DOCUMENTS

| | | | |
|---|---|---|---|
| 4,786,132 A | * 11/1988 | Gordon | 350/96.19 |
| 5,717,804 A | 2/1998 | Pan et al. | 385/94 |
| 5,812,716 A | 9/1998 | Ohishi | 385/92 |
| 5,930,430 A | 7/1999 | Pan et al. | 385/94 |
| 6,125,222 A | * 9/2000 | Anthon | 385/33 |

* cited by examiner

Primary Examiner—Brian Healy
Assistant Examiner—Sarah Woo
(74) Attorney, Agent, or Firm—I. Zborovsky

(57) ABSTRACT

A laser-diode assembly for generating a frequency-stabilized narrow-bandwidth light comprises a light source in the form of a semiconductor laser diode coupled via a first optical coupling device to one end of a first optical fiber. The other end of this fiber is coupled to a second or an output fiber via a second optical coupling device. The assembly is characterized by the fact that a long inner cavity is formed by a section of the optical system between two oppositely directed mirrors. The first mirror is applied onto the back side of the semiconductor laser diode, and the second mirror is applied onto a flat front side of one optical lens element or onto the back side of another optical lens element. These optical lens elements are parts of an optical coupling between the first and the second fibers. The first mirror completely reflects the entire light incident onto this mirror, whereas the second mirror reflects a major part of the light, e.g., about 90% and passes only a small part, e.g., 10% of the light incident onto this mirror. The Bragg grating is designed so that, in combination with the laser cavity L, it suppresses the side modes of the wavelength bands and transforms them into the central mode of the narrow wavelength band which can be passed through this grating. The light processed by the Bragg grating is passed through the second mirror to the output fiber, while the reflected light performs multiple cycles of reflection between both mirrors which thus form a laser resonator which amplifies the laser light output at the selected narrow waveband.

18 Claims, 5 Drawing Sheets

LASER-DIODE ASSEMBLY FOR GENERATING A FREQUENCY-STABILIZED NARROW-BANDWIDTH LIGHT AND A METHOD OF NARROWING LINEWIDTH OF THE SPECTRUM

FIELD OF THE INVENTION

The present invention relates to the field of optoelectronics, in particular, to laser-diode units for generating a frequency-stabilized narrow-bandwidth light. The invention also relates to a method of generating a stabilized narrow-bandwidth light of a selected frequency. The invention may find application in various fields where short wavelength compact lasers are used, such as flat-panel displays, projection displays, optical data readers, optical sensors, laser measurement systems, optical data storage, etc.

BACKGROUND OF THE INVENTION

At the present time, lasers find wide application in various fields. Especially in the recent years a tendency is observed for replacement of traditional solid-state and gas lasers with semiconductor lasers in view of their smaller dimensions, simplicity of use, and low cost. It is understood that such replacement is possible only if the replacement laser diodes possess at least the same properties with regard to the bandwidth characteristics and frequency stability as those in the lasers to be replaced. Semiconductor lasers with the above characteristics may find use in such fields as optical emission spectroscopy, laser-induced fluorescence analysis, transmission-absorption analysis, reflectometry, elipsometry, polarimetry, interferometry, Raman scattering analysis, non-linear optical diagnostics, etc.

It is obvious that in modern optical high-density data transmission systems stabilization of frequency is a very important factor for increasing density of information to be transmitted through the communication line. Therefore there is a great demand for semiconductor laser systems capable of generating a frequency-stabilized light of a selected wavelength in a narrow bandwidth of the light spectrum.

U.S. Pat. No. 5,812,716 issued in 1998 to Isamu Ohishi discloses an optical module and a temperature control method, wherein the optical module includes a light-emitting semiconductor laser, an optical waveguide in the form of a planar optical waveguide, a cooling device in the form of a Peltier device with a thermister for cooling the laser, and a package for containing the laser, one end portion of the optical waveguide, and the cooling device. The laser and the optical waveguide are optically coupled to each other. The optical waveguide has a grating section formed at the one end portion contained in the package for selectively reflecting only light with a fixed wavelength. The cooling device cools the grating section in addition to the light-emitting device. In this device, the grating section functions as a reflecting narrowband filter.

One advantage of the optical module of U.S. Pat. No. 5,812,716 is that it solves the problem of frequency stabilization by using a precision cooling system for stabilizing parameters of the system due to temperature stabilization. Another advantage is narrowing of the spectrum of the emitted light. Finally, the use of a Bragg grating section makes it possible to narrow the bandwidth.

However, in the optical module of U.S. Pat. No. 5,812,716 the Bragg grating is used as a passive frequency filter mainly for cutting off side modes of the semiconductor laser spectrum. As a result, the mean power of the output light emitted from the system is reduced proportionally to the cut-off portions of the spectrum.

U.S. Pat. Nos. 5,717,804 and 5,930,430 issued to J. J. Pan et al. in 1998 and in 1999, respectively, describe a method of narrowing the output wavelength and the laser diode assembly which fulfills the above function. The assembly contains a laser diode and an optical fiber section which receives the light output from the laser diode. The optical fiber section also has a fiber grating designed to operate as a bandpass filter. This fiber Bragg grating is designed so that the reflection band is partial, i.e., only a fraction of the light from the laser diode is reflected back. The reflected light increases the output of the laser diode at this wavelength band as compared to the light of other wavelength band of the light spectrum.

According to another embodiment of U.S. Pat. Nos. 5,717,804 and 5,930,430, two fiber (Bragg) gratings are used instead of one so that the combination of two gratings functions as a bandpass filter. As stated previously, a uniformly sinusoidal fiber Bragg grating has a precise and narrow wavelength band in which light is reflected by the fiber grating. Light outside the band is transmitted through the fiber grating. There are two techniques to widen the reflection band. The fiber grating may be linearly chirped, i.e., the periodicity of the fiber grating can be linearly varied. Alternatively, the fiber grating is created from a cascade of uniform fiber gratings, the reflection band of each uniform fiber grating contiguous with each other. The two fiber Bragg gratings have such a widened reflection range. Each grating has a slightly different wavelength range, as illustrated in FIG. 5 of the cited U.S. patents, which plots transmittance, the inverse of reflectance, versus wavelength for both gratings. The combination of the two gratings in series in the optical fiber section transmits light in a very narrow range (band), so that the optical fiber section now includes a high-performance bandpass filter. Light outside of the narrow range from the laser diode chip is reflected. Only light in the very narrow range passes out from the laser diode assembly.

However, as can be seen from the same FIG. 5 of the cited patents, the aforementioned laser assembly practically does not increase a signal/noise ratio and functions only with regard to narrowing of the bandwidth of the transmitted spectrum. It is an obvious disadvantage of the laser assembly of the aforementioned type which limits the scope of its practical application. Another disadvantage of the aforementioned known device is complicated manufacturing and assembling difficult for realization under industrial conditions.

OBJECTS OF THE INVENTION

It is an object of the invention to provide a laser-diode device, which is characterized by an increase in an output signal/noise ratio, increases the output light power at a selected narrow wavelength band, and provides a frequency stabilized narrow-band light of a selected wavelength at the output. Another object is to provide a laser-diode device which is suitable for manufacturing and assembling under industrial conditions. Still another object is to provide a method of stabilizing frequency and narrowing the linewidth of the spectrum of the light emitted from the laser device through external extended laser cavity.

SUMMARY OF THE INVENTION

A laser-diode assembly for generating a frequency-stabilized narrow-bandwidth light comprises a light source in the form of a semiconductor laser diode coupled via a first optical coupling device to one end of a first optical fiber. The other end of this fiber is coupled to a second or an output fiber via a second optical coupling device. The assembly is characterized by the fact that a long inner cavity is formed by a section of the optical system between two oppositely directed mirrors. The first mirror is applied onto the back side of the semiconductor laser diode, and the second mirror is applied onto a flat front side of one optical lens element with an appropriate coating or onto the back side of another optical lens element. These optical lens elements are parts of an optical coupling between the first and the second fibers. The first mirror completely reflects the entire light incident onto this mirror, whereas the second mirror reflects a major part of the light, e.g., about 90% and passes only a small part, e.g., 10% of the light through this mirror to the output coupling and then to the output optical fiber. The Bragg grating is designed so that, in combination with the laser cavity L, it suppresses the side modes of the wavelength bands and transforms them into the central mode with a narrow linewidth of the spectrum of the light that passed through this grating. The light spectrally processed by the Bragg grating is passed through the second mirror to the output fiber, while the reflected light performs multiple cycles of reflection between both mirrors which thus form a laser resonator which amplifies the laser light output at the selected narrow waveband with good radiation stability.

DETAILED DESCRIPTION OF THE INVENTION

Figure 1:
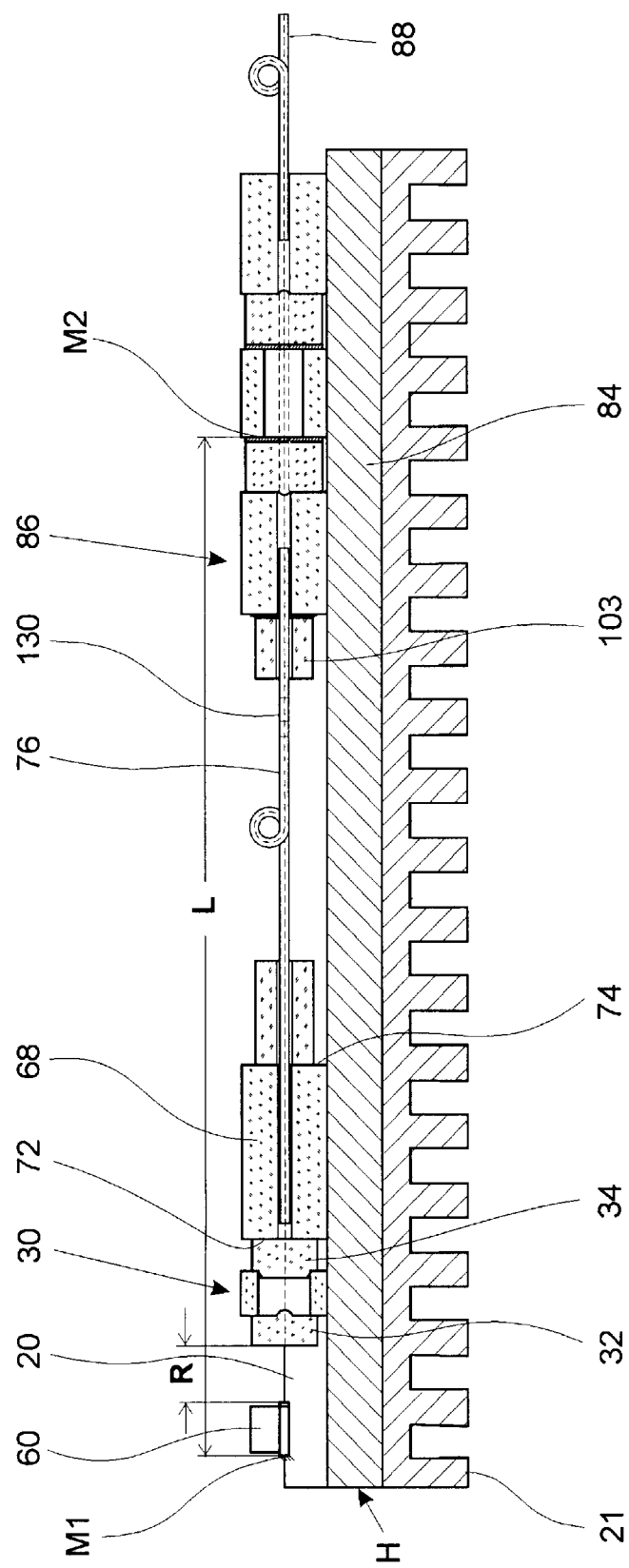
FIG. 1 is a longitudinal sectional view of a laser/fiber optic assembly of the invention.

A laser-diode assembly of the invention is shown in FIG. 1, which is a longitudinal sectional view. The assembly as a whole is supported by a rectangular housing H, which has a longitudinal rectangular groove 20 shown in FIG. 2, which is a partial three-dimensional view of the assembly of FIG. 1. The housing H is connected to a heat sink 21 which may have an electric control (not shown). This groove serves for placement and centering of the components of the device. A unit, which in general is designated by reference numeral 30, consists of two lens elements 32, 34 and a spacer 36 sandwiched between them. This unit constitutes an anamorphotic lens assembly.

Figure 2:
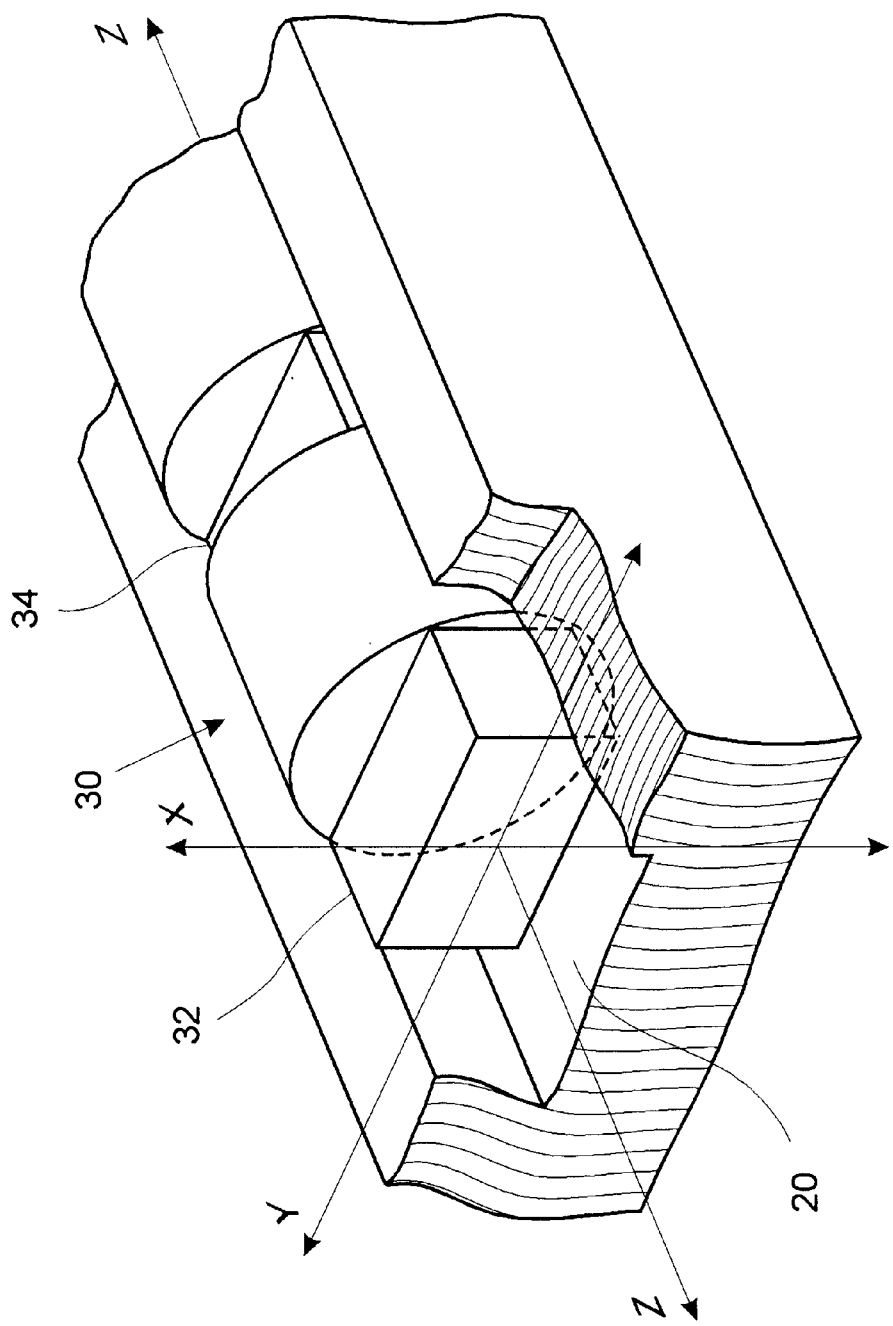
FIG. 2 is a partial three-dimensional view of the assembly of FIG. 1.

As shown in FIG. 2, in the illustrated embodiment the groove 20 has a rectangular cross section and a width that ensures gap-free fit of the anamorphotic lens assembly 30 in this groove. The parts that form the lens assembly 30 are connected into an integral unit, e.g., by gluing with a UV-curable epoxy glue. If necessary, they can be connected by thermal fusion. The flatness and parallelism of the end faces, as well as the aforementioned dimensions of the components that form the lens assembly ensure self-alignment and self-centering of the components during assembling.

Each lens element comprises a rectangular, e.g., square plate made of glass, quartz, or any other suitable optical material having flat and strictly parallel front and rear sides or end faces and a cylindrical aspherical lens on the mating front sides.

Figure 3A:
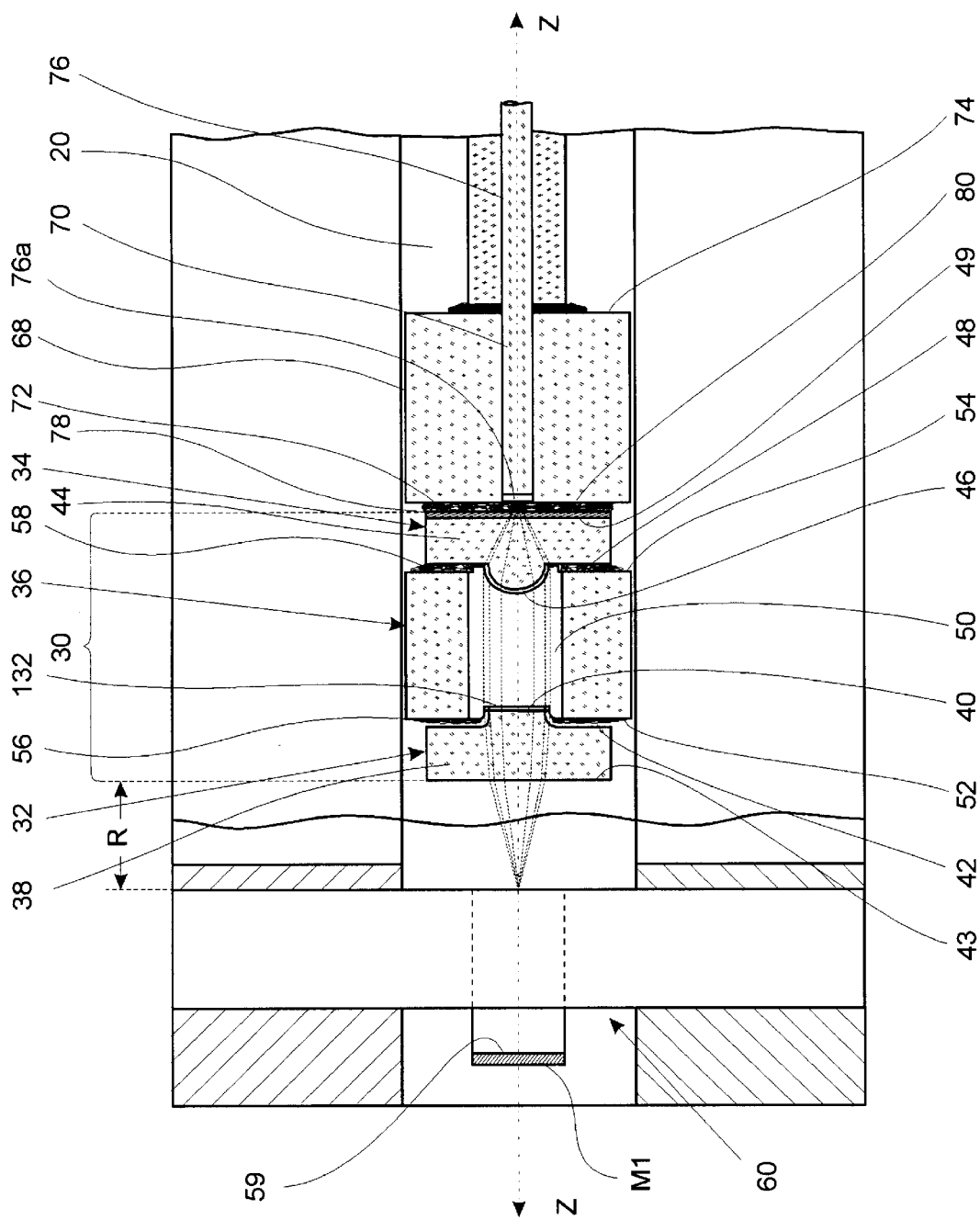
FIG. 3A is a partial view on a lager scale of an optical coupling between the laser diode and the optical fiber.

FIG. 3A is a partial longitudinal sectional view on a lager scale of an optical coupling between the laser diode and the optical fiber. Such a coupling has been described in our pending U.S. patent application Ser. No. 09/658,610. As shown in FIG. 3A, the lens element 32 comprises a plate 38 with an aspherical cylindrical lens 40 on the front side or end face 42 that faces the lens element 34. The end face 42 is strictly parallel to the end face 43 on the backside of the lens element 32. Similarly, the lens element 34 comprises a square plate 44 with an aspherical cylindrical lens 46 on the front side, e.g., on the end face 48 that faces the lens element 32. The backside, e.g., the end face 49 of the lens element 34 is strictly parallel to the end face 48 of this element. The aspherical cylindrical lenses 40 and 46 have their longitudinal axes X-X and Y-Y, respectively, turned by 90° relative to each other (FIG. 2). The axes of propagation of the light beam is axis Z-Z, which is perpendicular to axes X-X and Y-Y. In the illustrated embodiment, the lenses 40 and 46 are made integrally with the plate-like bodies of the lens elements 32 and 34, respectively, e.g., by chemical etching. If necessary, however, they can be produced by cutting a cylindrical body in a longitudinal direction and then gluing the half-cylinders to the end faces of the plates.

The spacer 36 is a ring-like element with a central hole 50 and two strictly parallel and flat end faces 52 and 54 (FIG. 3A). The reason that the end faces, i.e., 48, 49, 52, 54, 42, 43 should be strictly parallel to each other is that they function as reference surfaces for assembling. Their surface condition should ensure that deviation of the lenses 40, 46 from parallelism does not exceed 2 $\mu$m.

Shown on the left side of the anamorphotic lens assembly 30 in FIG. 1 is a laser diode unit 60, which is mounted on a ceramic support (not shown) mounted on the housing H. The laser diode 60 is supported so that the center of its emitter (not shown) is located on the optical axis of the lens assembly 30. An example of such a laser diode is a 916 nm single-mode edge-emitter type laser diode produced by Perkin Elmer Co. The laser diode of this type has a 1 $\mu$m×3 $\mu$m edge emitter. Another example is a laser diode of produced by Hitachi Co., Ltd. for radiating light with the wavelength of 635 nm. In fact, the principle of the invention is applicable to lasers of any types and designs that emit light with wavelengths in the range of 600 to 1600 nm. For example, the technology of the present invention also applicable to diodes of a VCEL type with emitters on a vertical cavity.

The groove 20 of the housing H, which supports all the aforementioned components, functions as an aligning and centering element, as well as a temperature-stabilizing/heat sinking chassis of the laser diode chip and the optical assembly. The spacer 36 has a round cross section. The diameter of this round cross section is equal to the width of the groove 20.

A distance R (FIG. 1) from the emitter of the laser diode 60 to the lens element 34 is within the range of 1 to 100 $\mu$m. The shortened distance between the emitter of the laser diode 60 and the lens element improves optical coupling efficiency, as compared to the TO-can mounting where this distance is relatively large. It is important to ensure divergence of the optical beam OB (FIG. 3A) corresponding to the input aperture of the anamorphotic lens assembly 30 for full optical coupling of the optical components.

The optical lenses 40 and 46 have the same length in the direction of their respective longitudinal axes X-X and Y-Y and this length has a magnitude that ensures gap-free snug fit of the lenses 40 and 46 in the hole 50 of the spacer 36 when the unit is assembled by sandwiching the spacer 36 between the lens elements 32 and 34 and the parts are secured together, e.g., by an optical glue 56, 58, e.g., a UV-cured NOA-61 epoxy-type adhesive.

Located on the side of the anamorphotic lens assembly 30 opposite to the laser diode 60 is a glass ferrule 68 with a central opening 70 and end faces 72 and 74 (FIGS. 1 and 3A). The ferrule 68 is also positioned in the groove 20. The external diameter of the ferrule 68 is equal to that of the spacer 36, and therefore the ferrule 68 is also self-centered in the groove 20. The end face 72 of the glass ferrule 68 is strictly parallel to the end face 49 of the lens element 34 with deviation from flatness of less than 1 μm. An optical fiber 76 is inserted into the central opening 70 so that its front end face 76a has a butt connection with the rear end face 49 via a thin layer 78 of a UV-curable optically matched epoxy glue (such as NOA-61 type adhesive) which is used for attaching the ferrule 68 as well as the end face 76a of the optical fiber 76 to the end face 49 of the lens element 34. This is shown in FIG. 3B which is a fragmental sectional view on a larger scale illustrating the butt connection of the fiber with the end face of the lens element.

The glue layer has a thickness of about 4–5 μm. The butt connection of the fiber to the flat side of the lens element ensures automatic positioning of the fiber in the device and thus simplicity and repeatability of such positioning under conditions of mass production. It is understood that reference numeral 76 designates both the core and the clad of the optical fiber, which are not designated separately.

It is obvious that the optical axes of the fiber 76, the laser diode 60, and the anamorphotic lens assembly 30 are strictly linear and coincident in all these components.

Figure 3B:
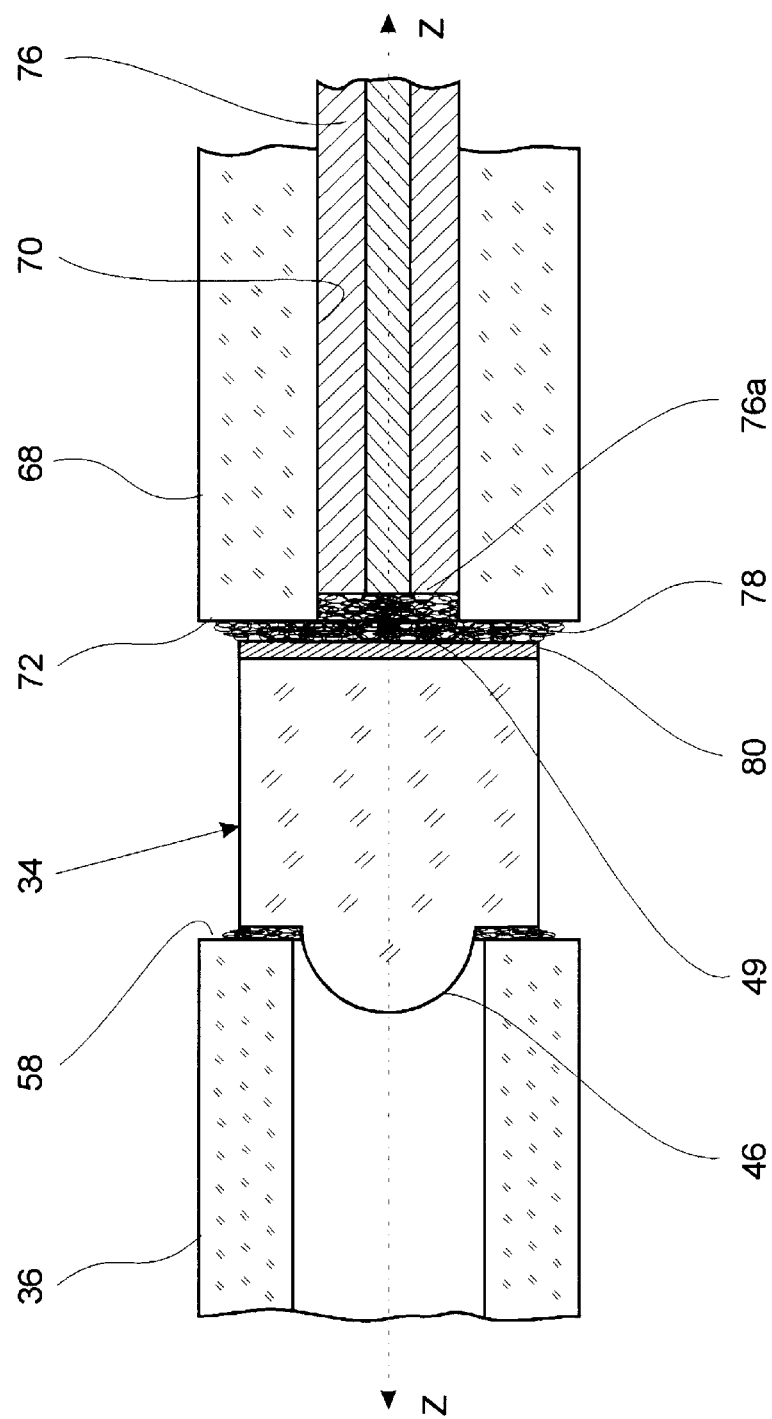
FIG. 3B is a fragmental sectional view on a larger scale illustrating the butt connection of the fiber with the end face of the lens element.

The flat surface 43 (FIG. 3A) of the lens element 32, including the lens 40, the flat surface 49 of the lens element 34, including the lens 46 have anti-reflective coatings (only one of which, i.e., the coating layer 80 on the flat surface 49 is shown in FIG. 3B). This coating 80 is index-matched with a glue layer 78, e. g., a NOA-61 optical epoxy layer shown in FIG. 3B, which may have a maximum thickness of about 4–5 μm. This improves optical coupling of the lens to the fiber and eliminates mechanical mismatch that may be caused by thermal deformations.

A mirror coating M1 (FIG. 3A) with full reflection of incident light is applied onto the back side 59 of the cavity of the semiconductor laser 60. The reflecting surface of this mirror coating faces the lens assembly 30.

The end of the fiber 76 opposite to the lens assembly 30 is inserted into a ferrule 84 of another optical coupler 86 (FIG. 1), which connects the fiber 76 with an output optical fiber 88. This connection is shown in more detail in FIG. 4, which is a longitudinal sectional view. As can be seen from this drawing, the ferrule 84 has a through opening 90. The end of the fiber 76 is inserted into one end of this opening, while an aspheric circular microlens 92 of a plate-like microlens element 94 is inserted with a tight fit into the opposite end of the opening 90. The microlens element 94 is glued to the mating end face 96 of the ferrule 84 with a layer 98 of a UV-curable glue. The aforementioned end of the fiber 76 is located a certain distance from the aforementioned aspheric circular microlens 92. This distance ensures formation of a collimated light beam B1 (FIG. 4) in a tubular separator 110 which is mentioned below.

When the fiber 76 is fixed in the ferrule 84 by a layer 102 of a UV-curable glue, the fiber end face 100 should be in an exact location with respect to the microlens 92. If necessary, the exact positioning and fixation of the fiber end face 100 can be facilitated by using an additional ferrule 103 and a layer 102 of the glue.

The flat end face 104 of the microlens element 94 is coated with a mirror coating M2 which passes only a fraction, e.g., about 10% of a selected narrow wavelength band of light incident on this mirror coating and reflects the remaining 90% of the selected wavelengths band of light through the fiber 76 back toward the laser, specifically towards the mirror coating M1. For example, for red light the selected band may be of 635 nm±0.4 nm. The semiconductor laser diode 60 may be, e.g., the one that generates light in the spectrum band of 635 nm±12.5 nm (semiconductor laser diodes produced by Hitachi, Sony, Toshiba, Phillips, etc.). The mirror M2 will reflect approximately 100% of light except for the portion that corresponds to the wavelength of 635 nm±0.4 nm.

The flat rear end face 104 of the microlens element 94 is glued via a layer 106 of a UV-curable glue to the front end face 108 of the aforementioned tubular separator 110 having a central opening 112 of a diameter larger than the diameter of the fiber 76.

The flat front end face 114 of another plate-like microlens element 116 is glued via a layer 118 of a UV-curable glue to the rear end face 120 of a ferrule 122. A circular aspheric microlens 124, which is formed on the flat front side 114 of the microlens element 116 inserted into a through opening 126 of the ferrule 122. An output optical fiber 88 of the entire system is inserted into the end of the opening 126, which is opposite to the fiber 76. The end face 128 of the fiber 88 should be located at a predetermined distance from the lens 124. In a real construction, positioning and fixation of end faces 100 and 128 of respective fibers 76 and 88 are carried out so as to obtaining the maximum output light signal in the fiber 88.

As shown in FIG. 1, the laser cavity L is formed by the following components: mirror coating M1 on the back side of the semiconductor laser diode 60, antireflective coating (not shown) on the front side o the semiconductor laser diode 60, the air gap R, the anamorphotic lens assembly 30, the optical fiber 76, the Bragg grating 130 written into the core of the optical fiber 76 (the position of the Bragg grating 130 depends on a specific design and can be anywhere along the fiber length), the microlens 94 attached to the glass ferrule assembly 84/103, and the mirror coating M2 on the flat surface of the microlens element 94.

Another essential feature of the system of the invention is a Bragg grating 130 (FIG. 1) written in the optical fiber 76 within the aforementioned laser cavity L. Brag gratings are also known as distributed Bragg reflectors, which are optical fibers or other media that have been modified by modulating the longitudinal index of refraction of the fiber core, cladding or both to form a pattern. A fiber equipped with Bragg grating functions to modify the optical passband of the fiber (transmission characteristic) in such a way as to only transmit a narrow and controlled wavelength band. The distributed Bragg reflectors typically are "lossless" devices. In principle, the Bragg gratings can be used as light reflectors or as spectrum shape or mode converters.

A typical distributed Bragg reflector comprises a length of optical fiber including a plurality of perturbations in the index of refraction substantially equally spaced along the fiber length. These perturbations selectively reflect light of wavelength λ equal to twice the spacing Λ between successive perturbations times the effective refractive index, i.e., $\lambda = 2n_{eff} \Lambda$, where λ is the vacuum wavelength and $n_{eff}$ is the effective refractive index of the fiber for the mode being propagated. The remaining wavelengths pass essentially unimpeded. In the system of my invention, such a distributed Bragg grating is used as a spectrum shape and mode converter for narrowing the spectrum bandwidth of the laser radiation, as well as for stabilization of the output laser diode characteristics and for gaining the light energy which is resonated within the laser cavity. The position of the Bragg grating in the fiber 76 with respect to the laser diode 60 is a matter of design and application.

By selecting an appropriate periodic spacing Λ between successive perturbations in the fiber with a distributed Bragg grating reflector, it becomes possible to select a mode, which is the most efficient for the operation of the semiconductor laser diode 60. In the system of the invention, such a mode is the one with the maximum intensity in the laser radiation spectrum. At the same time, the gain of the maximum intensity mode is accompanied by the suppression of the side modes of the spectrum.

Figure 4:
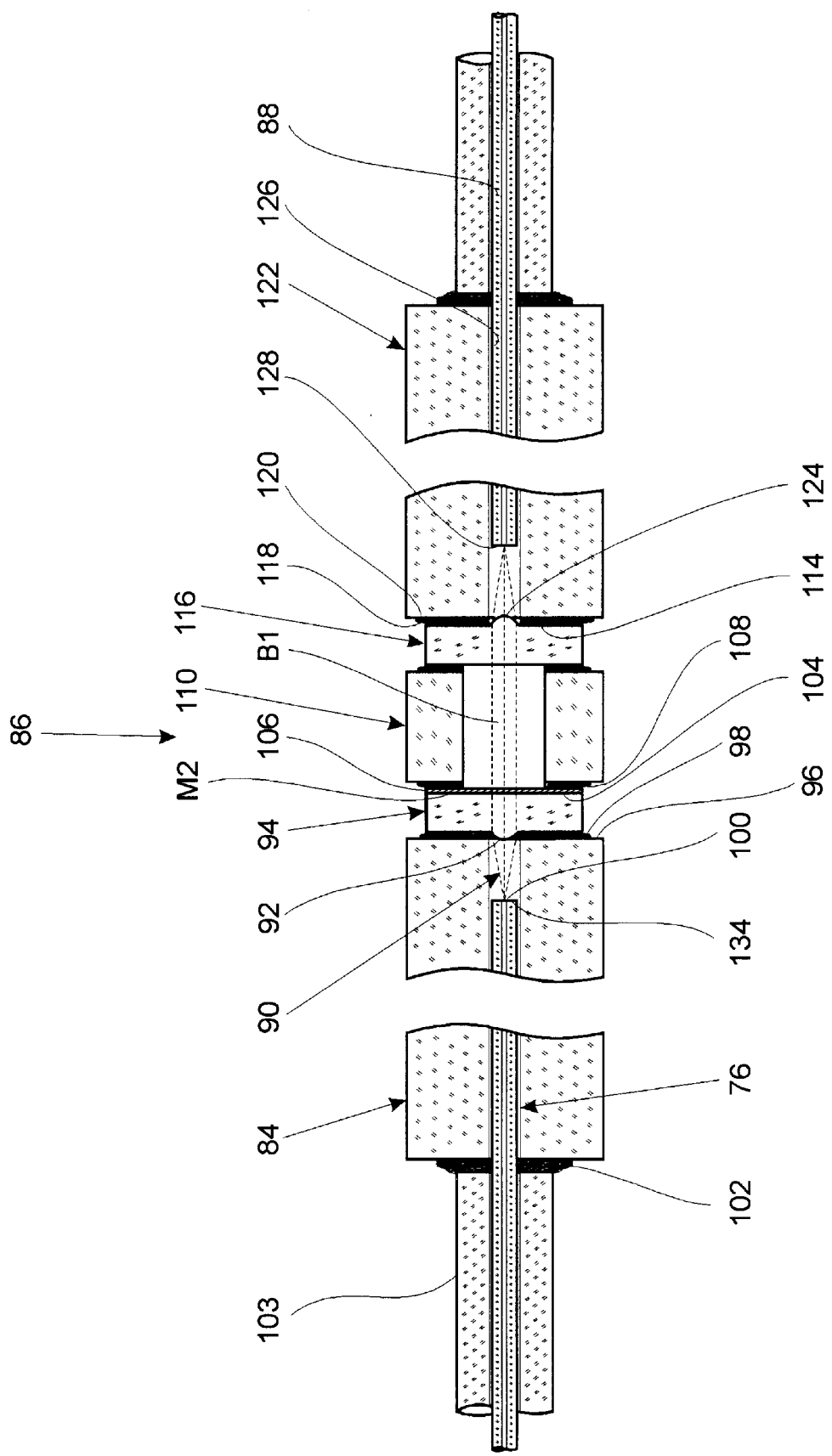
FIG. 4 is a longitudinal sectional view of a coupling between the output subassembly of the laser device and the output optical fiber.

An anti-reflective coating 132 can be applied onto the front end face 42 (FIG. 3A) of the first lens element 32, and an anti-reflective coating 134 can be applied onto the front end face of the optical fiber 76 (FIG. 4). Anti-reflective coatings can be applied onto the surfaces of the microlens, etc.

Operation of the System of the Invention

After the semiconductor laser 60 (FIG. 1) is activated, a diverged light beam, e.g., of 635 nm±12.5 nm wavelength emitted by the laser 60, propagates in the direction of the optical axis of the system, and passes through the lens element 32, the microlens 40 of which focuses this beam in the plane X–Z (FIG. 2). The focused beam is then propagates through the space between the microlenses 40 and 46 and passes through the microlens element 34, the microlens 46 of which focuses the beam in the plane Y–Z. As a result, the beam is collected in the point which is located in the center of the core on the mating end face 76a of the optical fiber 76 butt connected with the layer 78 of the index-matched glue to the flat end face 49 with the antireflective coating 80. The light beam then propagates through the optical fiber 76 to the output end 100 of the fiber 76 (FIG. 4). On its way, the light passes through the distributed Bragg grating 130 (FIG. 1), which by design selects the mode from the wide spectrum of radiation from the laser diode 60. A portion of the selected mode spectrum is reflected back to the laser diode. However, the most of the photons continue to flow to the mirror coating M2. The mode reflected from the Bragg grating 130 forces, due to photon stimulation, the radiation of the laser diode in the mode determined by the design of the Bragg grating. The process takes few cycles of photon reflections back and forth between the mirrors M1 and M2 (the cavity length), whereby the laser cavity enables light amplifications, i.e., gain for the selected wavelength.

The intensified light of the selected mode then enters the microlens 92 of the microlens element 94 and passes to the lens element 116 via the mirror M2 and through the opening 112 of the spacer 110 to the microlens element 116. The mirror M2 passes only a portion, e.g., 10% to 30%, of the light in the selected wavelength band, e.g., of 635±0.4 nm, to the output fiber 88. The remaining portion of the light is reflected back to the mirror M1 via the aforementioned optical elements of the laser cavity L. When this reflected light passes through the Bragg grating 130, the process of spectrum transformation and intensification of light of a selected wavelength with suppression of side modes is repeated. The reflected light is then again reflected from the mirror M1 and returns to the laser cavity L. The Bragg grating is designed so that, in combination with the laser cavity L, it suppresses the side modes of the wavelength bands and reflects the photons back to the laser diode. This leads to narrowing of the linewidth in the central mode of light radiation spectrum. The light spectrally processed by the Bragg grating is passed through the second mirror to the output fiber, while the reflected light performs multiple cycles of reflection between both mirrors which thus form a laser resonator which amplifies the laser light output at the selected narrow waveband.

Such an arrangement makes it possible to maintain high level of light radiation power on the selected frequency, which in the illustrated embodiment is the frequency of 635±0.4 nm. In combination with temperature control via a heat sink 21, it becomes possible to ensure long-term stability of the output light power with deviations not exceeding, e.g., 1%, or even lower than 0.1%.

Thus it has been shown that the invention provides a laser-diode device, which is characterized by an increase in an output signal/noise ratio, increases the output light power at a selected narrow wavelength band, and provides a frequency stabilized narrow-band light of a selected wavelength at the output. The invention also provides a laser-diode device which is suitable for manufacturing and assembling under industrial conditions. The invention also provides a method of stabilization of frequency and narrowing of the wavelength band of the light emitted from the laser device.

Although the invention has been described with reference to specific embodiments, it is understood that these embodiments were given only for illustrative purposes and that any changes and modifications with regard to shapes, designs, materials, and combinations thereof are possible, provided these changes and modifications do not depart from the scope of the patent claims. For example, the light source may comprise a superluminescent laser diode, a laser diode with an amplifier, etc. The housing H can be divided into two separate parts, one for the laser unit with the first coupling and anamorphotic lens assembly, and another one with the second coupling and the output fiber. This will allow individual temperature control optimal for separate units. The connection of the optical elements can be achieved by thermal fusion, rather than by adhesion. The first and second mirrors can be located in positions different from those described and shown in the illustrated embodiments, e.g., the first mirror can be installed on a separate support behind the semiconductor laser diode and at a distance from this diode. The second mirror can be formed on the rear side of the second spacer. In the last case it is important to apply antireflective coatings on the rear side of the first circular lens element, etc. It is also important to provide alignment of the mirrors with respect to the optical axis.

What is claimed is:

1. A method for selecting and stabilizing frequency of light emitted by a semiconductor laser diode, comprising:

providing a system of optical components arranged in the direction of light propagation, said system comprising a semiconductor laser diode that radiates a light of a given wavelength band, an input optical fiber, a laser cavity formed by a part of said optical components of said system between a first reflecting mirror essentially with 100% reflection of light and a second reflecting mirror that passes only a selected portion of said light of a predetermined frequency and contains a frequency selection means for selecting a light of a predetermined frequency in said given wavelength band, a first coupling means for coupling said semiconductor laser diode to said input optical fiber, an output optical fiber, a second optical coupling for coupling said input optical fiber with said output optical fiber;

generating said light of said given wavelength band by said semiconductor laser diode;

passing said light of said given wavelength band through said frequency selection means;

selecting light of a predetermined frequency in said given wavelength band and narrowing said given wavelength band;

propagating the light of narrowed wavelength band further to said second mirror;

passing only the light of said narrowed wavelength band through said second mirror to said output optical fiber;

reflecting the remaining portion of said light of a predetermined frequency back to said first mirror via said frequency selection means to said first mirror;

reflecting said remaining portion of said light, that was received from said second reflecting mirror after passing through said frequency selection means, from said first reflecting mirror; and continuing generating said light of said given wavelength band by said semiconductor laser diode, while repeating, for the light reflected from said second mirror, at least once all said steps starting from said step of passing said light through said frequency selection means.

2. The method of claim 1, further comprising the step of stabilizing the output power of the light sent to said output optical fiber by controlling the temperature of said part of said optical components that forms said laser cavity.

3. The method of claim 1, wherein said frequency selection means comprises a Bragg grating.

4. The method of claim 2, wherein said frequency selection means comprises a Bragg grating.

5. The method of claim 4, wherein said first reflecting mirror is located behind said semiconductor laser diode, said second coupling comprising at least one of said optical components with a flat surface which is strictly perpendicular to said direction of light propagation, said second reflecting mirror being applied onto said flat surface.

6. The method of claim 5, wherein said first coupling means comprises at least a lens assembly.

7. The method of claim 6, wherein said lens assembly is an anamorphotic lens assembly.

8. A laser-diode assembly for generating a frequency-stabilized narrow-bandwidth light having a light propagation direction, said laser-diode assembly being composed of optical components and comprises:

a semiconductor laser diode that radiates a light of a given wavelength band;

an input optical fiber;

a laser cavity formed by a part of said optical components and comprising said input optical fiber, and at least a first reflecting mirror essentially with 100% reflection of light, a second reflecting mirror that passes only a selected portion of said light of a predetermined frequency, and a frequency selection means formed in said input optical fiber for selecting a light of a predetermined frequency in said given wavelength band;

a first coupling means for coupling said semiconductor laser diode to said input optical fiber;

an output optical fiber; and a second coupling means for coupling said input optical fiber to said output optical fiber.

9. The laser-diode assembly of claim 8, further comprising means for controlling temperature of said part of said optical components that forms said laser cavity.

10. The laser-diode assembly of claim 8, wherein said frequency selection means comprises a Bragg grating.

11. The laser-diode assembly of claim 9, wherein said frequency selection means comprises a Bragg grating.

12. The laser-diode assembly of claim 10, wherein said first reflecting mirror is located behind said semiconductor laser diode, said second coupling comprising at least one of said optical components with a flat surface which is strictly perpendicular to said direction of light propagation, said second reflecting mirror being applied onto said flat surface.

13. The laser-diode assembly of claim 11, wherein said first reflecting mirror is located behind said semiconductor laser diode, said second coupling comprising at least one of said optical components with a flat surface which is strictly perpendicular to said direction of light propagation, said second reflecting mirror being applied onto said flat surface.

14. The laser-diode assembly of claim 12, wherein said first coupling means comprises at least a lens assembly.

15. The laser-diode assembly of claim 14, wherein said lens assembly is an anamorphotic lens assembly.

16. The laser-diode assembly of claim 13, wherein said first coupling means comprises at least a lens assembly.

17. The laser-diode assembly of claim 16, wherein said lens assembly is an anamorphotic lens assembly.

18. The laser-diode assembly of claim 14, wherein said first coupling means comprises at least said lens assembly and a rear part of said input optical fiber which has one end in butt connection with said lens assembly, said second optical coupling comprising at least a front part of said input optical fiber, an first optical fiber ferrule with a through opening for another end of said input optical fiber, a first microlens element with a first circular aspherical microlens inserted into said through opening from the side opposite to said input optical fiber, a second microlens element with a second circular aspherical microlens, a spacer between said first microlens element and said second microlens element, and a second optical fiber ferrule with a through opening, said second circular aspherical microlens being inserted into said through opening of said second optical fiber ferrule from one side thereof, said output optical fiber being inserted into said through opening of said second optical fiber ferrule from a side opposite to said one side thereof.

* * * * *